(12) United States Patent
Spickermann et al.

(10) Patent No.: US 6,963,677 B1
(45) Date of Patent: Nov. 8, 2005

(54) OPTICAL MEMORY AND LOGIC USING CROSS-SWITCHES

(75) Inventors: Ralph Spickermann, Redwood City, CA (US); Steven R. Sakamoto, Santa Clara, CA (US)

(73) Assignee: Lockheed Martin Corp., Bethesda, MD (US)

( * ) Notice: Subject to any disclaimer, the term of this patent is extended or adjusted under 35 U.S.C. 154(b) by 197 days.

(21) Appl. No.: 10/722,223

(22) Filed: Nov. 25, 2003

(51) Int. Cl.[7] .......................... G02B 6/26; G11C 13/04; G02F 3/00

(52) U.S. Cl. .................. 385/16; 385/1; 385/15; 385/18; 385/24; 385/14; 365/64; 359/108; 359/107

(58) Field of Search .................... 385/1, 2, 3, 14, 385/15, 16, 17, 18, 24, 39, 40, 129, 130; 365/64, 106, 234; 359/107, 108

(56) References Cited

U.S. PATENT DOCUMENTS

| | | | | |
|---|---|---|---|---|
| 3,588,749 A | * | 6/1971 | Meyer | 359/258 |
| 4,382,660 A | * | 5/1983 | Pratt et al. | 359/244 |
| 4,585,301 A | * | 4/1986 | Bialkowski | 359/243 |
| 4,789,843 A | * | 12/1988 | Hicks | 359/238 |
| 5,295,010 A | * | 3/1994 | Barnes et al. | 359/107 |
| 5,452,123 A | * | 9/1995 | Asher et al. | 359/296 |
| 5,737,102 A | * | 4/1998 | Asher | 359/107 |
| 6,151,428 A | * | 11/2000 | Vahala et al. | 385/11 |

* cited by examiner

*Primary Examiner*—Brian M. Healy
(74) *Attorney, Agent, or Firm*—Kenneth W. Float

(57) ABSTRACT

An all-optical, asynchronous binary storage cell implemented by optically induced total internal reflection cross-junction waveguide switches. The term "all-optical" refers to directing of optical data signals as a result of optical control signal inputs without the need for conversion between optical and electrical domains. The binary cell is a building block for a programmable all-optical random access memory (AORAM) device. The AORAM device enables circuits and networks that require optical buffers.

9 Claims, 7 Drawing Sheets

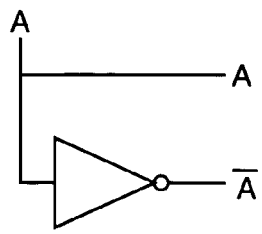
Fig. 7a
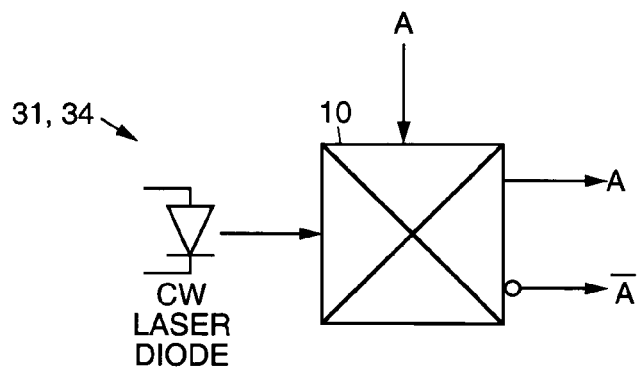
Fig. 7b
Fig. 8a
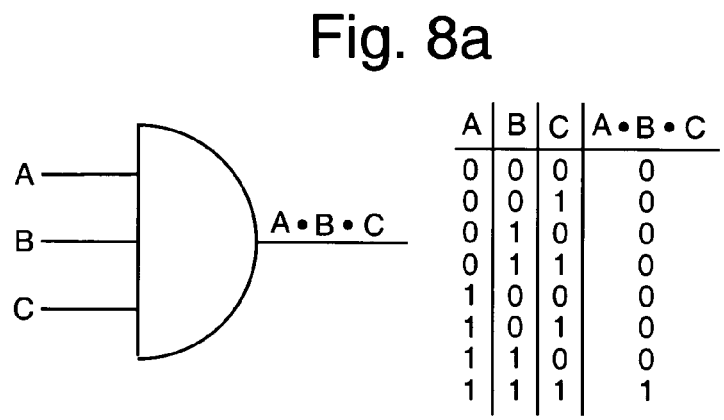
| A | B | C | A•B•C |
|---|---|---|-------|
| 0 | 0 | 0 | 0 |
| 0 | 0 | 1 | 0 |
| 0 | 1 | 0 | 0 |
| 0 | 1 | 1 | 0 |
| 1 | 0 | 0 | 0 |
| 1 | 0 | 1 | 0 |
| 1 | 1 | 0 | 0 |
| 1 | 1 | 1 | 1 |
Fig. 8b
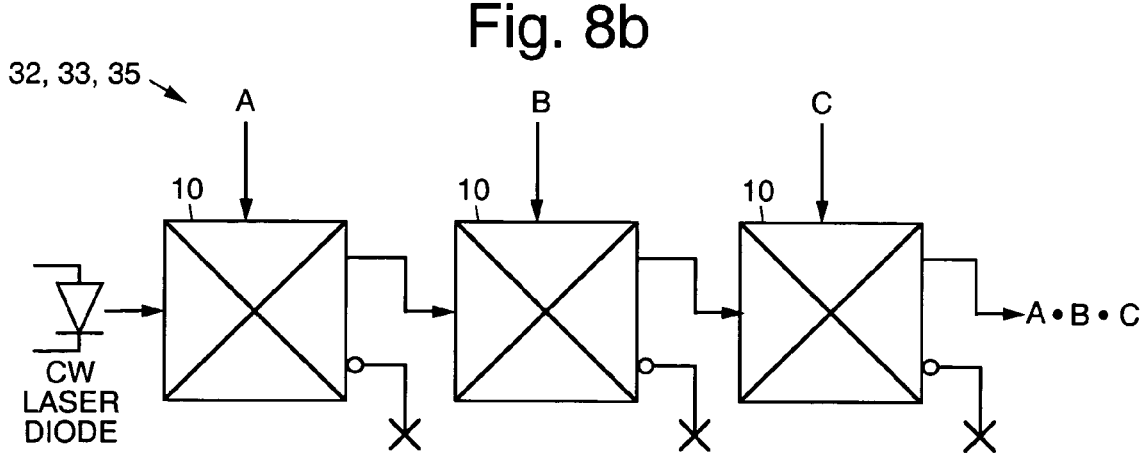

OPTICAL MEMORY AND LOGIC USING CROSS-SWITCHES

BACKGROUND

The present invention relates generally to optical memory, and more particularly, to improved optical memory and logic using cross-switches.

Conventional all-optical memory approaches include technologies based on fiber delay lines, semiconductor optical amplifiers, quantum dots, self-electro-optic effect devices, and gain-coupled lasers.

Fiber delay lines are not randomly accessible nor are they very small. Semiconductor optical amplifiers, quantum dots, self-electro-optic effect devices and gain-coupled lasers all require electronic biasing. It would be advantageous to have optical memory and logic that improves upon these conventional approaches.

It is an objective of the present invention to provide for improved optical memory and logic employing cross-switches. It is also an objective of the present invention to provide for an all-optical asynchronous binary memory cell and logic functions implemented with optically induced total internal reflection X-junction waveguide optical switches.

SUMMARY OF THE INVENTION

To meet the above and other objectives, the present invention provides for optical memory and logic that employs cross-switches to implement all-optical asynchronous binary memory cell and logic functions. The optical memory and logic functions are implemented with optically induced total internal reflection cross-junction waveguide optical switches.

The binary cell is a building block for a programmable all-optical random access memory (AORAM) device. AORAM devices enable circuits and networks that require optical buffers.

The present invention provides for all-optical random access memory (buffer) and all-optical logic, which is necessary for all-optical computing and all-optical networks. The present invention uses optically-induced total internal reflection to achieve all-optical switching, logic and memory functions. Devices based on the cross-switches employed in the present invention require no electronic biasing and are very compact. The present all-optical memory cell is randomly accessible.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 7a illustrates an equivalent electrical digital circuit of a single cross-switch device;

FIG. 7b illustrates a schematic of the device depicted in FIG. 7a;

FIG. 8a illustrates an electrical digital schematic of a 3-port AND gate with the corresponding truth table;

FIG. 8b illustrates a cross-switch implementation of the 3-port AND gate shown in FIG. 8a;

FIG. 10b illustrates a cross-switch embodiment of the 2-port NAND gate shown in FIG. 10a;

DETAILED DESCRIPTION

Figure 1:
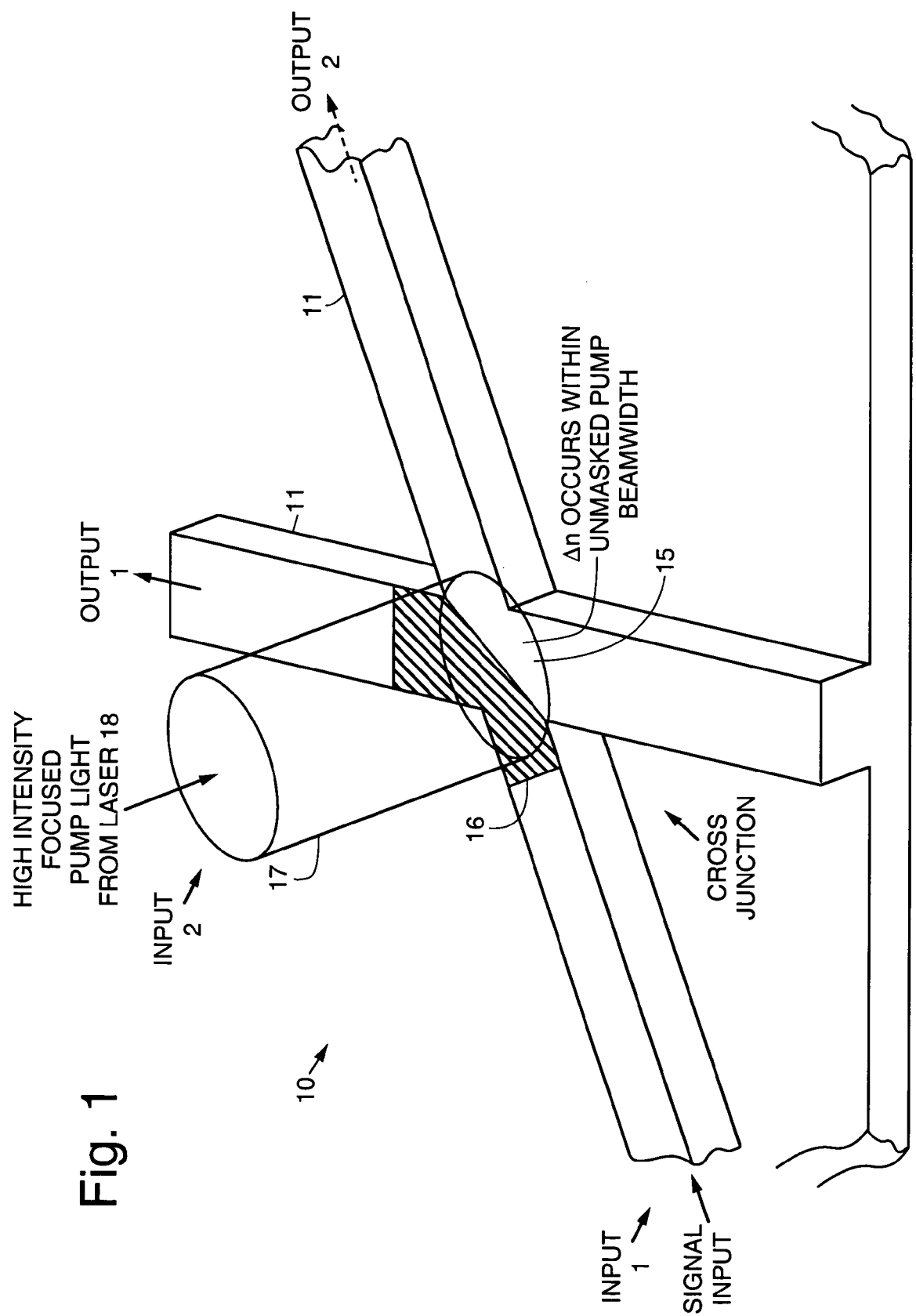
FIG. 1 illustrates an exemplary cross-switch in accordance with the principles of the present invention when observed at an oblique angle.

Referring to the drawing figures, FIG. 1 illustrates an exemplary cross-switch 10 in accordance with the principles of the present invention when observed at an oblique angle. The exemplary cross-switch 10 may be used to implement an all-optical, asynchronous binary storage cell, wherein the cross-switch 10 employs optically induced total internal reflection. The binary cell is a building block for a programmable all-optical random access memory (AORAM) device, which enables circuits and networks that require optical buffers.

In order to simplify the definition of a binary memory cell, several logic gates and their functions are described below. Corresponding all-optical equivalent logic gates using cross-switches are also described. As defined herein, the term "all-optical" refers to the directing of optical data signals as a result of optical control signal inputs without the need for conversions between optical and electrical domains.

The all-optical switch 10 is referred to a cross-switch 10. A general understanding of the cross-switch 10 is provided in U.S. patent application Ser. No. 10/264,609, filed Oct. 4, 2002, and entitled, "Optically Induced Total Internal Reflection X-Junction Waveguide Optical Switch, Network and Optical Switching Method", which is assigned to the assignee of the present invention. The contents of this application are incorporated herein in its entirety by reference.

Referring to FIG. 1, the primary function of the exemplary cross-switch 10 is to direct incoming guided light from a first input port (Input 1) to one of two output ports (Output 1 or Output 2), based on the presence or absence of light from a second input port (Input 2, or pump port).

The exemplary optical switch 10 shown in FIG. 1 has a 1-input-by-2-output (1×2) port configuration. Activation of the cross-junction waveguide switch 10 uses a high intensity pump beam 17 (comprising an optical carrier), which may be provided by a laser 18, such as a vertical cavity surface emitting laser 18, for example.

As is shown in FIG. 1, the exemplary optical switch 10 comprises a plurality of single mode optical ridge waveguides 11 intersecting at an angle between the waveguides 11 at a cross-junction (or X-junction). The ridge waveguides 11 have a two-dimensional effective refractive index $n_r$, while cladding in a surrounding field area has two-dimensional refractive index nc such that $n_r > n_c$. An optical signal propagates with a mode effective index $n_m$, which is a weighted average of $n_r$ and $n_c$. An interaction region 15 illustrated by the dashed box in the center of the X-junction is where optical switching action occurs. The interaction region 15 may be activated by a high intensity pump beam 17 that illuminates the top-side of the interaction region 15. These aspects of the optical switch 10 are discussed in detail in the above-referenced US Patent Application.

Figure 2:
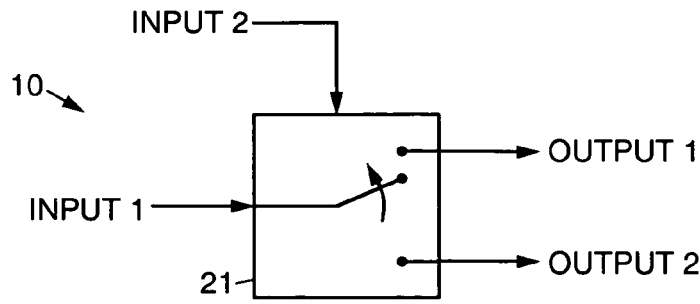
FIG. 2 illustrates an equivalent optical analog circuit model for the cross-switch device shown in FIG. 1.

FIG. 2 shows an equivalent optical analog circuit model of the cross-switch 10 illustrated in FIG. 1. The cross switch 10 is represented by a switch 21. The implied functionality is as follows. If Input 2 is active, then light from Input 1 is directed to Output 1. If a signal from Input 2 is absent, then incoming light from Input 1 exits via Output 2. In essence, Input 2 is a control port for an optically actuated 1×2 optical cross-switch 10.

Figure 3:
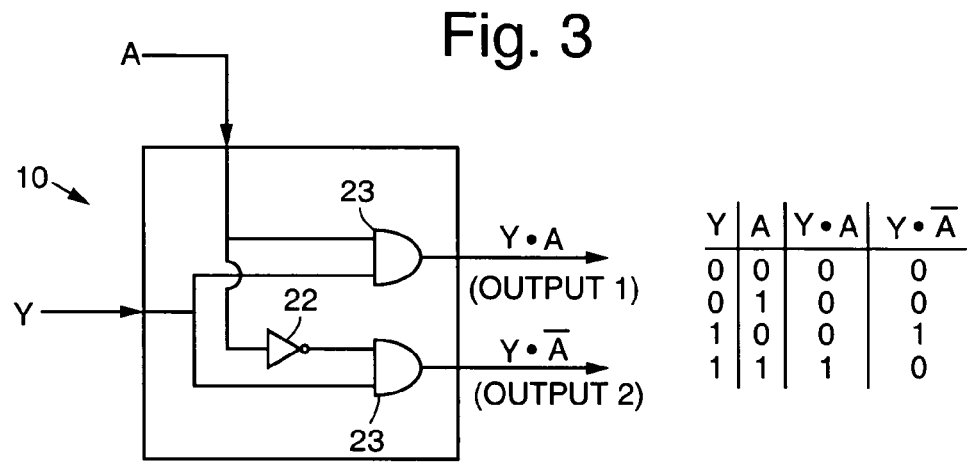
FIG. 3 illustrates an optical equivalent digital circuit of the device shown in FIG. 1.

For binary data (i.e., digital or on-off keyed signals), the optical equivalent circuit of the cross-switch 10 shown in FIG. 3 is applicable, where standard digital element representations for an inverter 22 and an AND gate 23 are used. The associated truth table is shown at the right of the cross-switch 10. The Boolean logic variables Y and A are substituted for the two ports, Input 1 and Input 2, respectively. The following conditions apply: no output signal results if Y=0 (i.e., no incoming signal light); if Y= 1 (i.e., light constantly applied to Input 1), then Output 1 provides a copy of a digital input to A, while Output 2 simultaneously produces the digital complement of A. The latter condition is key to logic gate implementations using the cross-switch 10, and is further illustrated in FIG. 4.

Figure 4:
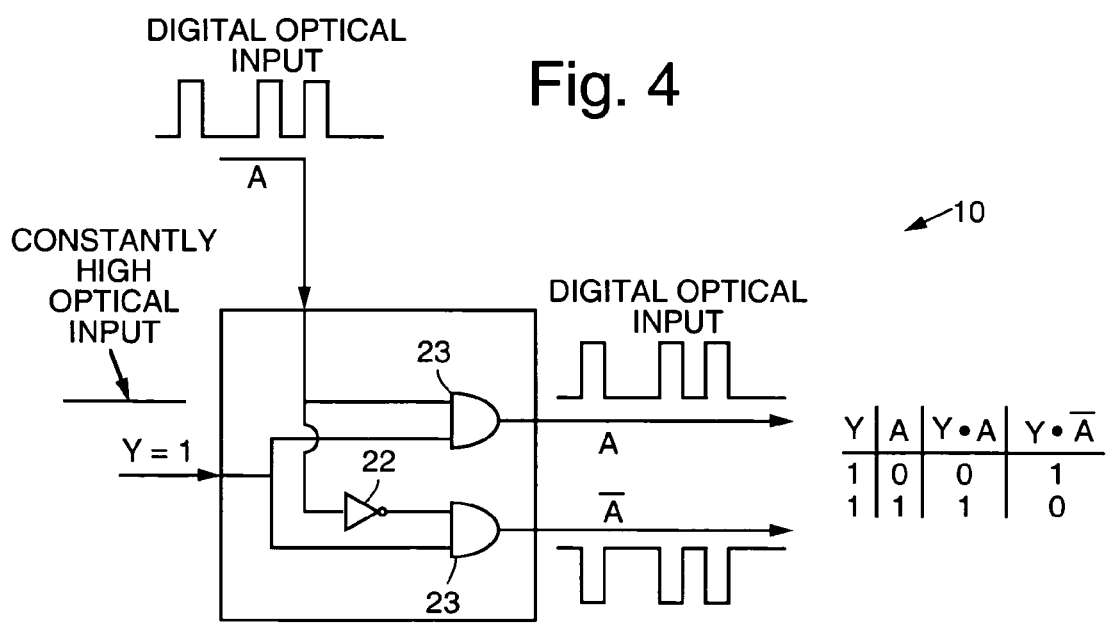
FIG. 4 illustrates an exemplary logic circuit implemented in accordance with the present invention.
Figure 5:
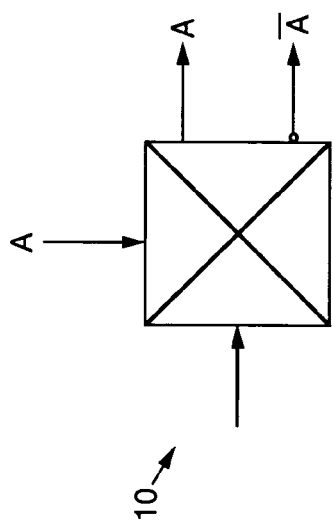
FIG. 5 illustrates a proposed optical digital equivalent schematic corresponding to FIG. 4.

FIG. 4 shows that an example digital optical signal is applied to Input 2 and a continuous wave (CW) optical signal is applied to Input 1 to effect a copy and complement of A. In order to simplify future schematic representations, FIG. 5 is used throughout the remainder of this description to describe the Y=1 condition optical digital equivalent circuit. In practice, the Y=1 condition can be obtained by coupling a CW laser diode directly to Input 1 of the cross-switch 10.

Figure 6:
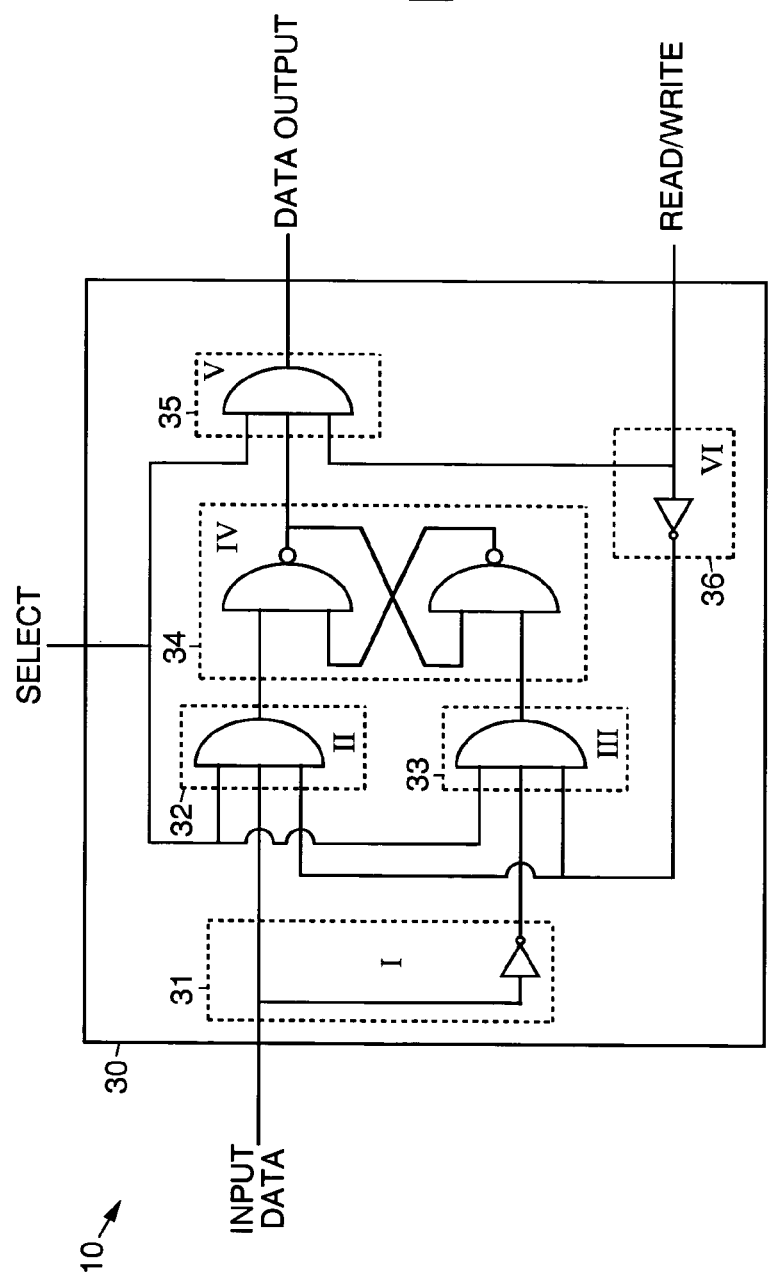
FIG. 6 illustrates an electrical digital equivalent circuit for an asynchronous binary memory cell.

An electrical digital equivalent circuit for an asynchronous binary memory cell 30 is shown in FIG. 6. This memory cell 30 is adapted from a circuit described by M. Morris Mano, in Computer Engineering: Hardware Design, Prentice-Hall, New Jersey, 1988.

The memory cell 30 is subdivided into six sections to aid in demonstrating fundamental building blocks: sections 31 and 34 (sections I and VI) provide a copy and a digital complement of the input signal; sections 32, 33 and 35 (sections II, III and V) are 3-port AND gates 32, 33, 35; section 34 (section IV) is an S-R latch 34. Optical implementations for each of the building blocks is described below.

The equivalent electrical digital circuit of Sections 31 and 34 (sections I and VI) is shown in FIG. 7a. For digital optical signals, a single cross-switch 10 provides at its outputs, both a copy of, and the complement of, the signal applied to Input 2 (assuming that Input 1=1). Therefore, the cross-switch 10 implementation of FIG. 7a is simply a single cross-switch device, the schematic of which is depicted in FIG. 7b, with a CW laser explicitly shown at Input 1 to represent the Y=1 condition.

Sections II, III and V represent 3-port AND gates 32, 33, 35, respectively. The electrical digital schematic of the 3-port AND gates 32, 33, 35 is shown in FIG. 8a, along with its corresponding truth table. Note that a '1' at the output is only possible if all input ports are set 'high' (A=B=C=1).

The cross-switch implementation of the 3-port AND gate function is shown in FIG. 8b. It is comprised of three cascaded cross-switches 10, each with its own control signal. The complemented output is not used, and is therefore terminated. The second switch 10 (with B input control) receives a switchable incoming light signal only if one is passed to it from the first switch 10 (with A input control). Similarly for the third cascaded switch 10 (with C input control), light must first be passed through the first and second switches 10. Thus, the AND function is developed It is conceivable to string an indefinite number of switches in order to create an N-port optical AND gate 32, 33 and 35. The timing of the control signals account for potentially different optical path lengths and the signal time-of-flight.

Figure 9:
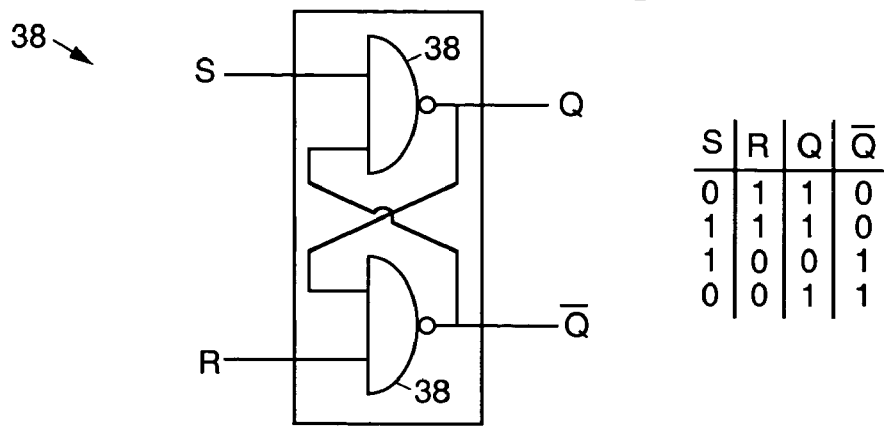
FIG. 9 illustrates an equivalent digital electrical diagram along with the corresponding truth table of a S-R (set/reset) latch.
Figure 10A:
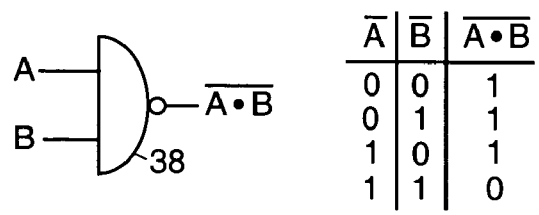
FIG. 10a illustrates an electrical digital representation of a 2-port NAND gate along with its corresponding truth table.
Figure 10B:
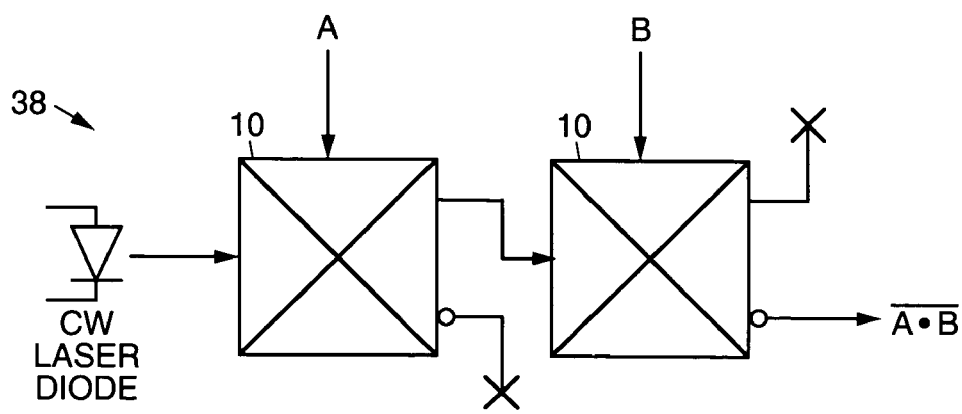

Section 34 (IV) is the S-R (set/reset) latch 34. The equivalent digital electrical diagram along with the corresponding truth table is shown in FIG. 9. This particular implementation uses two cross-coupled NAND gates 38. Thus, in order to demonstrate an optical S-R latch 34, an equivalent cross-switch implementation of a NAND gate 38 is first required. FIG. 10a shows the electrical digital representation of a 2-port NAND gate 38, along with its corresponding truth table. The cross-switch version is illustrated in FIG. 10b. This circuit is very similar to the AND gate 32, 33, 35 described previously (FIG. 8b), except that the complementary output of the final cascaded device (with control input B) is used to provide the NAND signal. Likewise, an N-port NAND gate 38 can be created from N-cascaded cross-switches 10. The cross-coupled optical NAND gates 38 may be combined to form the all-optical S-R latch 34 shown is FIG. 11.

As for signal levels, when the output of one gate/switch/section is used as the input/pump control signal for a subsequent gate/switch/section, it is conceivable that the optical power requires boosting between these stages. If required, optical amplifiers may be inserted between stages in order to increase the optical signal level. Adding such amplification does not change the principle operation of the logic gates described herein.

Figure 11:
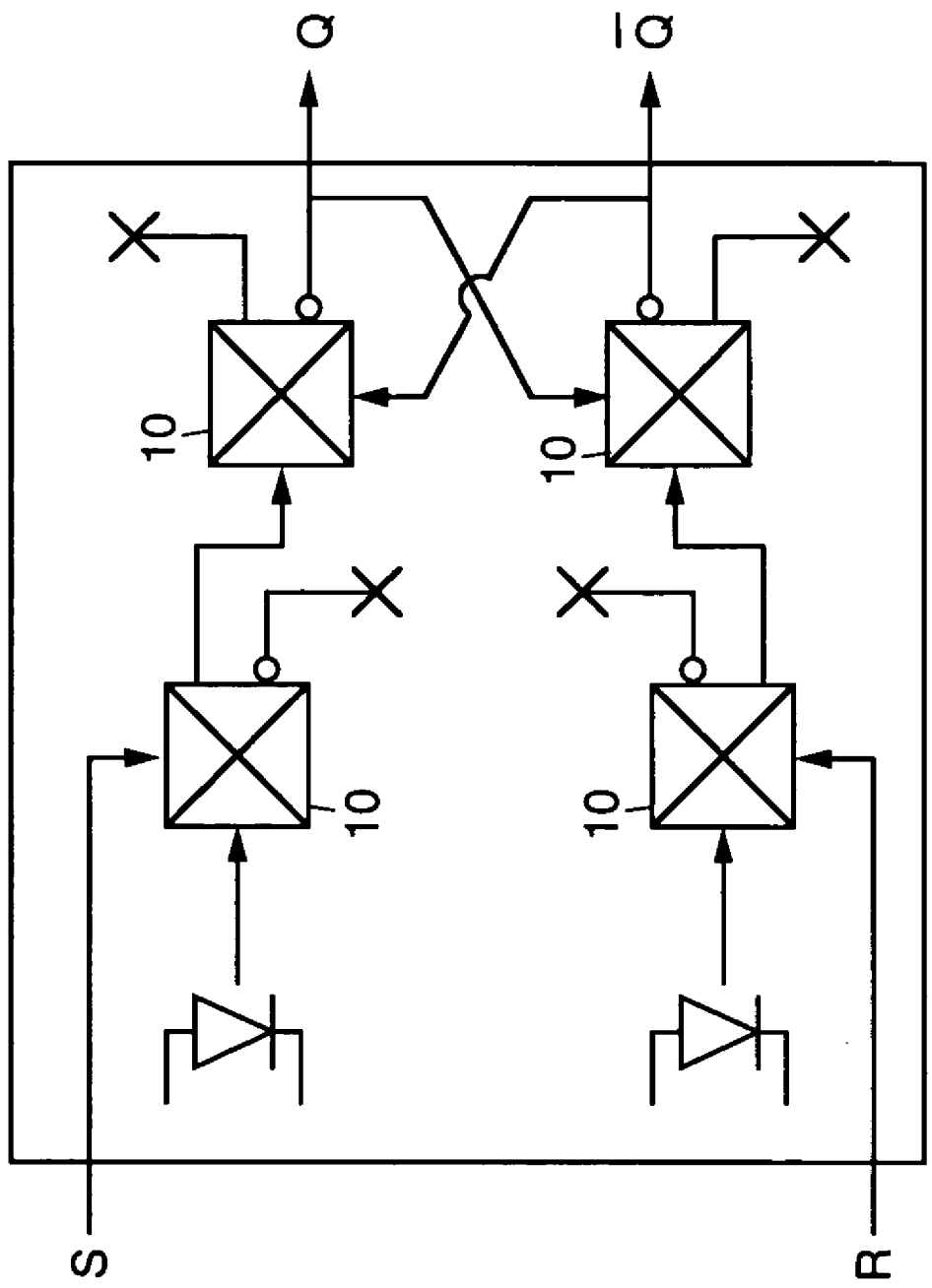
FIG. 11 illustrates cross-coupled optical NAND gates that are combined to form an all-optical S-R latch.
Figure 12:
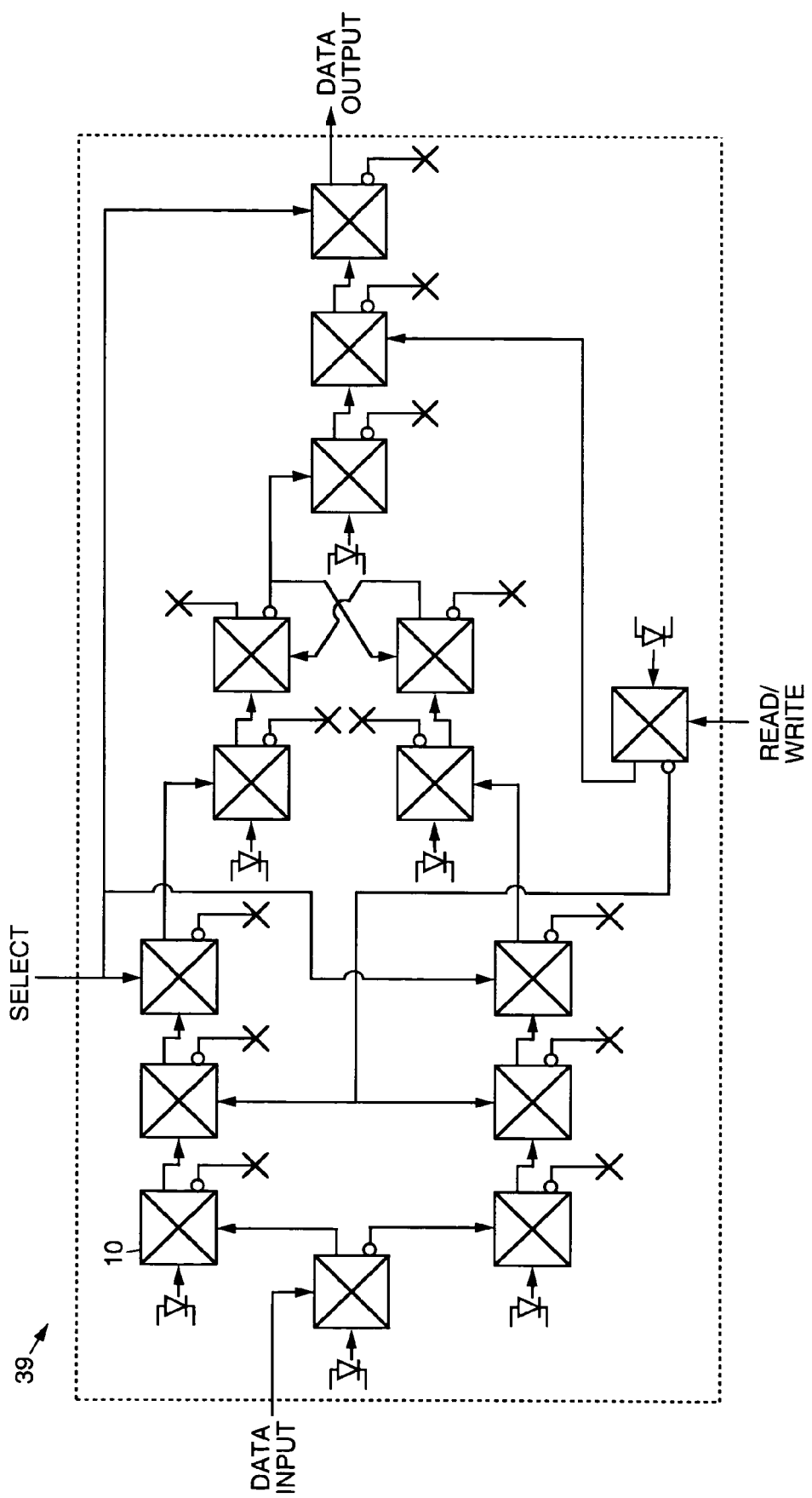
FIG. 12 illustrates an all-optical memory cell that combines the cross-switch logic gates shown in FIGS. 7b, 8b and 11.

Finally, substituting all the cross-switch logic gate implementations shown in FIGS. 7b, 8b and 11 for their corresponding sections in the memory cell shown in FIG. 6, produces an all-optical binary memory cell 39 shown in FIG. 12. FIG. 12 thus shows an all-optical binary memory cell 39 using the cross-switches 10.

Thus, improved optical memory and logic using cross-switches have been disclosed. It is to be understood that the described embodiments are merely illustrative of some of the many specific embodiments which represent applications of the principles of the present invention, such as open stub reflection circuits and logic pulse generation circuits, for example. Clearly, numerous and other arrangements can be readily devised by those skilled in the art without departing from the scope of the invention.

What is claimed is:

1. Optical apparatus, comprising:
a constant wave (CW) laser source;
a digitally modulated pump laser source; and
a first cross-junction waveguide optical switch having a first optical input for receiving light from the CW laser source, a second optical input for receiving the first optical input pump signal, a first optical output for outputting a digital copy of the first optical input pump signal, and a second optical output for outputting an inverted copy of the first optical input pump signal, and wherein the first optical input CW signal is controllably directed to the first or second optical outputs as a result of total internal reflection within the optical switch that is optically induced by the digitally modulated light output by the pump laser source.

2. The apparatus recited in claim 1 further comprising:
a second cross-junction waveguide optical switch having a first optical input for receiving the non-inverted output signal from the first optical switch, a second input for receiving a second digitally modulated optical input pump signal, a first optical output for outputting the digital product of the second optical input pump signal and the non-inverted output from the first optical switch, and a second optical output for outputting an inverted digital product of the second optical input pump signal and the non-inverted output from the first optical switch.

3. The apparatus recited in claim 2 wherein the non-inverted output from the second optical switch is a digital product of the first and second digital input pump signals and implements a two-input AND gate function.

4. The apparatus recited in claim 2 wherein the inverted output product from the second optical switch implements a two-input NAND gate function.

5. The apparatus recited in claim 2 further comprising:
a third optical switch having a first optical input for receiving the non-inverted output signal from the second optical switch, a second input for receiving a third digitally modulated optical input pump signal, a first optical output for outputting the digital product of the third optical input pump signal and the non-inverted output signal from the second optical switch, and a second optical output for outputting an inverted digital product of the third optical input pump signal and the non-inverted output signal from the second optical switch.

6. The apparatus recited in claim 5 wherein the non-inverted output from the third optical switch is a digital product of the first, second and third digital input pump signals and implements a three-input AND gate function.

7. The apparatus recited in claim 5 wherein the inverted output product from the third optical switch implements a three-input NAND gate function.

8. Optical apparatus for implementing an S-R latch function, comprising:
a first CW laser source;
a first optical switch having a first optical input for receiving light from the first CW laser source, a second optical input for receiving a first digitally modulated optical input pump signal (S), a first optical output for outputting a digital copy of the first optical input pump signal, and a second optical output for outputting an inverted copy of the first optical input pump signal;
a second optical switch having a first optical input for receiving the non-inverted output signal from the first optical switch, a second input for receiving a second digitally modulated optical input pump signal ($\overline{Q}$), a first optical output for outputting the digital product of the second optical input pump signal and the non-inverted output signal from the first optical switch, and a second optical output (Q) for outputting an inverted digital product of the second optical input pump signal and the non-inverted output signal from the first optical switch;

a second CW laser source;
a third optical switch having a first optical input for receiving light from the second CW laser source, a second optical input for receiving a second digitally modulated optical input pump signal (R), a first optical output for outputting a digital copy of the second optical input pump signal, and a second optical output for outputting an inverted copy of the second optical input pump signal; and
a fourth optical switch having a first optical input for receiving the non-inverted output signal from the third optical switch, a second input for receiving a second digitally modulated optical input pump signal (Q), a first optical output for outputting the digital product of the second optical input pump signal and the non-inverted output signal from the third optical switch, and a second optical output ($\overline{Q}$) for outputting an inverted digital product of the second optical input pump signal and the non-inverted output signal from the third optical switch; and
wherein the inverted second optical output signal ($\overline{Q}$) of the fourth optical switch is input to the second input of the second optical switch, and the inverted second optical output signal (Q) of the second optical switch is input to the second input of the fourth optical switch.

9. An optical binary memory cell comprising:
(1) a first optical switch having a first optical input for receiving light from a first CW laser source, a second optical input for receiving a digitally modulated optical DATA INPUT pump signal, a first optical output for outputting a digital copy of the optical DATA INPUT pump signal, and a second optical output for outputting an inverted copy of the optical DATA INPUT pump signal;
(2) a second optical switch having a first optical input for receiving light from a second CW laser source, a second optical input for receiving a digitally modulated optical READ/WRITE input pump signal, a first optical output for outputting a digital copy of the optical READ/WRITE input pump signal, and a second optical output for outputting an inverted copy of the optical READ/WRITE input pump signal;
(3) first and second three-input optical AND gates that each comprise:
a third optical switch having a first optical input for receiving light from a CW laser source, a second optical input for respectively receiving the non-inverted and inverted optical output signals from the first optical switch, a first optical output for outputting a digital copy of the second optical input signal to the third optical switch, and a second optical output for outputting an inverted copy of the second optical input signal to the third optical switch;
a fourth optical switch having a first optical input for receiving the non-inverted optical signal output by the first optical switch, a second input for receiving the inverted optical output signal from the second optical switch, a first optical output for outputting a digital product of the optical input signals to the fourth optical switch, and a second optical output for outputting an inverted product of the optical input signals to the fourth optical switch; and
a fifth optical switch having a first optical input for receiving the non-inverted optical data output signal from the second optical switch, a second input for receiving a digitally modulated SELECT optical input pump signal, a first optical output for outputting a digital product of the optical input signals to the fifth optical switch, and a second optical output for outputting an inverted product of the optical input signals to the fifth optical switch, and wherein the non-inverted output from the fifth optical switch comprises the output of the three-input optical AND gate;

(4) first and second two-port optical NAND gates that each comprise:

a sixth optical switch having a first optical input for receiving light from a CW laser source, a second optical input for receiving the non-inverted optical signal output by the respective first and second three-input optical AND gates, a first optical output for outputting a digital copy of the second optical input signal to the first optical switch, and a second optical output for outputting an inverted copy of the second optical input signal to the sixth optical switch; and a seventh optical switch having a first optical input for receiving the non-inverted optical signal outputted by the respective sixth optical switch, a second input for receiving a second optical input signal comprising an output signal from the opposing NAND gate, a first optical output for outputting a digital product of the optical input signals to the seventh optical switch, and a second optical output for outputting an inverted product of the optical input signals to the seventh optical switch;

wherein the output of the first two-port optical NAND gate comprises the second optical output of the second optical switch, and the output of the second two-port optical NAND gate comprises the first optical output of the second optical switch; and (5) a third three-input optical AND gate that comprises:

an eighth optical switch having a first optical input for receiving light from a CW laser source, a second optical input for receiving the optical output signal from the first two-port optical NAND gate, a first optical output for outputting a digital copy of the second optical input signal to the eighth optical switch, and a second optical output for outputting an inverted copy of the second optical input signal to the eighth optical switch;

a ninth optical switch having a first optical input for receiving the non-inverted optical output signal from the first switch, a second input for receiving the non-inverted optical output signal from the second optical switch, a first optical output for outputting a digital product of the optical input signals to the ninth optical switch, and a second optical output for outputting an inverted product of the optical input signals to the ninth optical switch; and a tenth optical switch having a first optical input for receiving the non-inverted optical output signal from the second optical switch, a second input for receiving a digitally modulated SELECT optical input pump signal, a first optical output for outputting a digital product of the optical input signals to the tenth optical switch, and a second optical output for outputting an inverted product of the optical input signals to the tenth optical switch, and which implements a three-input AND gate function that outputs an optical data output signal from the memory cell.

* * * * *